United States Patent
Guo et al.

(10) Patent No.: US 11,128,100 B2
(45) Date of Patent: Sep. 21, 2021

(54) VCSEL ILLUMINATOR PACKAGE INCLUDING AN OPTICAL STRUCTURE INTEGRATED IN THE ENCAPSULANT

(71) Applicant: Princeton Optronics, Inc., Mercerville, NJ (US)

(72) Inventors: Baiming Guo, Old Bridge, NJ (US); Qing Wang, Plainsboro, NJ (US); Laurence Watkins, Pennington, NJ (US); Jean-Francois Seurin, Princeton Junction, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 0 days.

(21) Appl. No.: 16/483,610

(22) PCT Filed: Jan. 11, 2018

(86) PCT No.: PCT/US2018/013291
§ 371 (c)(1),
(2) Date: Aug. 5, 2019

(87) PCT Pub. No.: WO2018/147963
PCT Pub. Date: Aug. 16, 2018

(65) Prior Publication Data
US 2020/0067264 A1    Feb. 27, 2020

Related U.S. Application Data

(60) Provisional application No. 62/456,140, filed on Feb. 8, 2017.

(51) Int. Cl.
*H01S 5/42* (2006.01)
*H01S 5/02255* (2021.01)
(Continued)

(52) U.S. Cl.
CPC ...... *H01S 5/02234* (2021.01); *H01S 5/02255* (2021.01); *H01S 5/423* (2013.01); *H01S 5/005* (2013.01)

(58) Field of Classification Search
CPC .. H01S 5/02292; H01S 5/18305; H01S 5/022; H01S 5/02228; H01S 5/423
(Continued)

(56) References Cited

U.S. PATENT DOCUMENTS 5,410,563 A * 4/1995 Nakamura ............... B41J 2/471
372/101
6,015,239 A    1/2000 Moore
(Continued)

FOREIGN PATENT DOCUMENTS

CN    101496189 A    7/2009
CN    103647214 A    3/2014
(Continued)

OTHER PUBLICATIONS

International Preliminary Report on Patentability for Application No. PCT/US2018/013291 dated Aug. 13, 2019 (7 pages).
(Continued)

*Primary Examiner* — Tuan N Nguyen
(74) *Attorney, Agent, or Firm* — Michael Best and Friedrich LLP

(57) ABSTRACT

A VCSEL illuminator package includes one or more VCSELs in a substrate. The one or more VCSELs are operable to generate a VCSEL output radiation beam. An encapsulant covers the one or more VCSELs, and an optical structure is integrated in the encapsulant. The optical structure is disposed in a path of the VCSEL output radiation beam and is operable to change at least one of a propagation characteristic or intensity distribution of the VCSEL output radiation beam exiting the encapsulant.

20 Claims, 10 Drawing Sheets

(51) Int. Cl.
*H01S 5/00* (2006.01)
*H01S 5/02234* (2021.01)

(58) Field of Classification Search
USPC .................................................. 372/50.124
See application file for complete search history.

(56) References Cited

U.S. PATENT DOCUMENTS

| | | | |
|---|---|---|---|
| 6,567,435 B1 | 5/2003 | Scott et al. | |
| 6,845,118 B1 | 1/2005 | Scott | |
| 7,208,725 B2 | 4/2007 | Sherrer et al. | |
| 7,679,095 B2 | 3/2010 | Kondo | |
| 7,835,410 B2 | 11/2010 | Guenter et al. | |
| 7,956,375 B2* | 6/2011 | Li | H01L 33/54 257/98 |
| 8,575,642 B1* | 11/2013 | Shum | H01L 33/44 257/98 |
| 8,764,238 B2 | 7/2014 | Brokilacchio | |
| 9,005,262 B2 | 4/2015 | Liu et al. | |
| 2002/0181899 A1 | 12/2002 | Tartaglia et al. | |
| 2004/0256630 A1* | 12/2004 | Cao | F21K 9/232 257/98 |
| 2005/0248008 A1 | 11/2005 | Wilson | |
| 2007/0272839 A1 | 11/2007 | Schultz et al. | |
| 2008/0308639 A1 | 12/2008 | Stern et al. | |
| 2009/0050911 A1 | 2/2009 | Chakraborty | |
| 2012/0007130 A1* | 1/2012 | Hoelen | H01L 33/504 257/98 |
| 2013/0266326 A1 | 10/2013 | Trilumina | |
| 2014/0160751 A1 | 6/2014 | Hogan et al. | |
| 2014/0376092 A1* | 12/2014 | Mor | H01S 5/005 359/569 |
| 2015/0280393 A1 | 10/2015 | Hogan et al. | |
| 2015/0355470 A1* | 12/2015 | Herschbach | F21V 5/08 362/11 |
| 2015/0377696 A1 | 12/2015 | Shpunt et al. | |
| 2016/0254638 A1* | 9/2016 | Chen | H01S 5/423 362/11 |
| 2016/0352071 A1 | 12/2016 | Vixar | |
| 2017/0280031 A1* | 9/2017 | Price | H04N 5/2253 |

FOREIGN PATENT DOCUMENTS

| | | |
|---|---|---|
| CN | 104362510 A | 2/2015 |
| CN | 104662462 A | 5/2015 |
| CN | 106030201 A | 10/2016 |
| WO | 93/21673 A1 | 10/1993 |

OTHER PUBLICATIONS

ISR/KR, International Search Report for PCT/US2018/013291 (dated May 8, 2018).

Search Report issued from the European Patent Office for related Application No. 18750812.2 dated Apr. 7, 2020 (8 Pages).

Office Action issued from the Chinese Patent Office for related Application No. 201880020257.X dated Oct. 26, 2020 (10 Pages including Statement of Relevance).

* cited by examiner

VCSEL ILLUMINATOR PACKAGE INCLUDING AN OPTICAL STRUCTURE INTEGRATED IN THE ENCAPSULANT

FIELD OF THE DISCLOSURE

The present disclosure relates to miniature VCSEL illuminator modules and packages wherein the VCSEL device is encapsulated by an optically transparent material which incorporates one or more optical function element(s) formed in the encapsulant for modifying the characteristics of the VCSEL output beam.

BACKGROUND

New features are being added to cell phones and tablets which include technologies to record three dimensional images, sense motion and gestures etc. Automobiles and other transportation vehicles are being outfitted with a multitude of LIDAR type sensors and other types of sensors for autonomous operation of the vehicle. The digital recording methods use various types of miniature illuminators which interact with cameras to record dynamical events in three dimensional regions. These illuminators can be of various forms and deliver different types of functions. Some illuminate a wide area with very short pulses for LIDAR type measurements recording time of flight information. Other illuminators are pulsed or CW and project structured light patterns onto the scene. The digital camera records an image of the structured light pattern and then software algorithms are used to determine 3 dimensional scene information from modifications in the pattern image.

The illuminators need to be small in size, typically 3 mm or less high and a few millimeters lateral dimensions. For vehicle applications they need to be robust to withstand harsh environmental conditions. These illuminators must be designed for high volume low cost manufacture and also for low cost assembly into the device they are going to be used in. This means the illuminator should be compatible with high volume electronic surface mount assembly practices.

One technology that is suitable for miniature illuminators is high power VCSEL devices and array devices. These can be pulsed with very fast rise times suitable for time of flight applications. They are small but produce high power laser beams with efficient electro-optic conversion. The output beam is typically well collimated however various optical components can be placed in the beam to modify the beam properties to the specific application.

Current packaging technology for miniature illuminators can be quite complex and uses extra components such as spacers for mounting optical components at the specific design operating location. This invention discloses a simpler packaging technology for producing high optical power VCSEL based miniature illuminators for such applications. They can be manufactured in high volume at low cost. The module is encapsulated which provides protection for the VCSEL against harsh environments.

SUMMARY

The present disclosure describes VCSEL illuminator packages that include an optical structure integrated in the encapsulant that covers the VCSEL device(s).

For example, one aspect describes a VCSEL illuminator package that includes one or more VCSELs in a substrate. The one or more VCSELs are operable to generate a VCSEL output radiation beam. An encapsulant covers the one or more VCSELs, and an optical structure is integrated in the encapsulant. The optical structure is disposed in a path of the VCSEL output radiation beam and is operable to change at least one of a propagation characteristic or intensity distribution of the VCSEL output radiation beam exiting the encapsulant.

Another aspect describes a method of manufacturing a VCSEL illuminator package. The method includes providing one or more VCSELs in a substrate, where the one or more VCSELs operable to generate a VCSEL output radiation beam. An encapsulant is provided to cover the one or more VCSELs, and an optical structure is integrated with the encapsulant. The optical structure is disposed in a path of the VCSEL output radiation beam and is operable to change at least one of a propagation characteristic or intensity distribution of the VCSEL output radiation beam exiting the encapsulant.

Some embodiments can overcome the complexity and lack of robustness of current illuminator modules using an encapsulant to protect the VCSEL device or array of devices. Instead of using separate optical elements to form the desired optical output beam for the specific application the optical function is fabricated in the encapsulating material. The optical element cab be formed, for example, on the surface of the encapsulant where the VCSEL beam propagates out of the encapsulant. However, this is not limiting, and the optical function can be formed inside the surface of the encapsulating material. In this way a single piece module which includes the VCSEL and the optical function to form the required illumination beam can be fabricated.

Various optical element functions can be formed in the encapsulant including, but not limited to, positive or negative lenses, aspheric lenses, microlenses, mirrors and freeform structures. The optical function can be a combination of these elements such as a bulk lens with microlenses to form a scrambled beam to reduce speckle effects. The structures can be refractive or diffractive in various combinations to achieve the desired illumination pattern. Another advantage of this invention is the avoidance of backreflections from separate optical components which could otherwise destabilize or cause noise in the VCSEL operation. Separate optical components normally require anti-reflection coatings which add to the cost.

The encapsulant can use a range of transparent materials such as optical grade silicone, UV curing epoxy or other optical polymers. These can be used singly or a combination of materials can be incorporated and formed. The encapsulant can be molded onto the top of a VCSEL or VCSEL array. In this embodiment a surface mount VCSEL would be preferred but not required so that the electrical contacts are both on the bottom side of the VCSEL and the encapsulant is on the top side. This configuration produces a small simple surface mountable encapsulated illumination package.

The VCSEL may also be mounted on a submount or printed circuit board suitable for assembling into a single piece complete module. In this situation, the encapsulant would completely enclose the VCSEL but may partially or completely enclose the submount or PCB. The VCSEL may be a surface mount VCSEL with both electrical contacts on the non-emitting side. In VCSEL on submount modules the submount or printed circuit board would be surface mountable with contacts on both sides, one side for the VCSEL and the other for surface mounting into a package.

The various embodiments of this invention enable low cost and more reliable illumination modules to be made since the module is a single piece package. It can be made in a small form factor for mobile devices with simplified designs. It is surface mountable which is consistent with low cost high volume electronic manufacturing processes. The encapsulant provides a robust protection for the VCSEL resulting in a single piece illumination module that can be used in harsh environments.

Thus, in some implementations, a robust encapsulated VCSEL illumination package includes an integrated optical diffuser element to modify the intensity or other optical characteristics of the output radiation beam. The source can be, for example, a single VCSEL device or an array of VCSEL devices in a common substrate. A transparent encapsulant is formed on the VCSEL and the surface of the encapsulant where the output beam emerges is formed into the optical diffusing structure. The surface of the encapsulant at the location of the optical diffuser can be flat or curved to add optical power for further control of the beam propagation characteristics. Another embodiment includes a mirror on the encapsulant surface to change the direction of the illuminating beam. The VCSEL can also include a submount such that the encapsulant encloses the VCSEL and the submount. One embodiment involves configuring the VCSEL or the submount with all electrical contacts on the bottom surface to provide a robust single component surface mount illumination module.

Other aspects, features and advantages will be readily apparent from the following detailed description, the accompanying drawings and the claims.

BRIEF DESCRIPTION OF THE DRAWINGS

The drawings that accompany this specification are a part of the specification and illustrate one or more embodiments of the present invention, but are not to be construed as limiting. The embodiments will be more clearly understood when the following detailed description is read in conjunction with the accompanying drawings.

FIG. 5(a) uses a flat mirror surface to maintain the VCSEL beam divergence and FIG. 5(b) uses a curved reflector to change the beam divergence.

FIG. 6(a) shows an encapsulant with a flat mirror surface to redirect the VCSEL beam followed by a diffusing structure on the output surface to modify the divergence and intensity distribution of the beam. FIG. 6(b) describes a configuration in which the reflector surface comprises a mirror surface as well as a diffuser structure. The beam is output through a different region of the encapsulation surface with a modified divergence and intensity distribution introduced by the diffusing structure.

FIG. 10(a) combines a positive convex lens profile with a microstructure such as microlens which both collimates the VCSEL beam and locally scatters or scramble the beam. FIG. 10(b) combines a negative concave lens profile with the microstructure to create a more divergent beam which is also scrambled. Scrambling the beam would have benefits in reducing speckle effects encountered with coherent laser beams impinging on surfaces.

DETAILED DESCRIPTION

Various aspects of the encapsulated VCSEL module are described in different embodiments. These embodiments may be practiced as is, or aspects from different embodiments in combinations and sub-combinations may be adapted to suit a specific application or to satisfy other requirements for example, size of the illuminator module, combinations of optical functions, illumination pattern requirements, environmental conditions, configuration of the final completed assembly incorporating the module etc.

Figure 1:
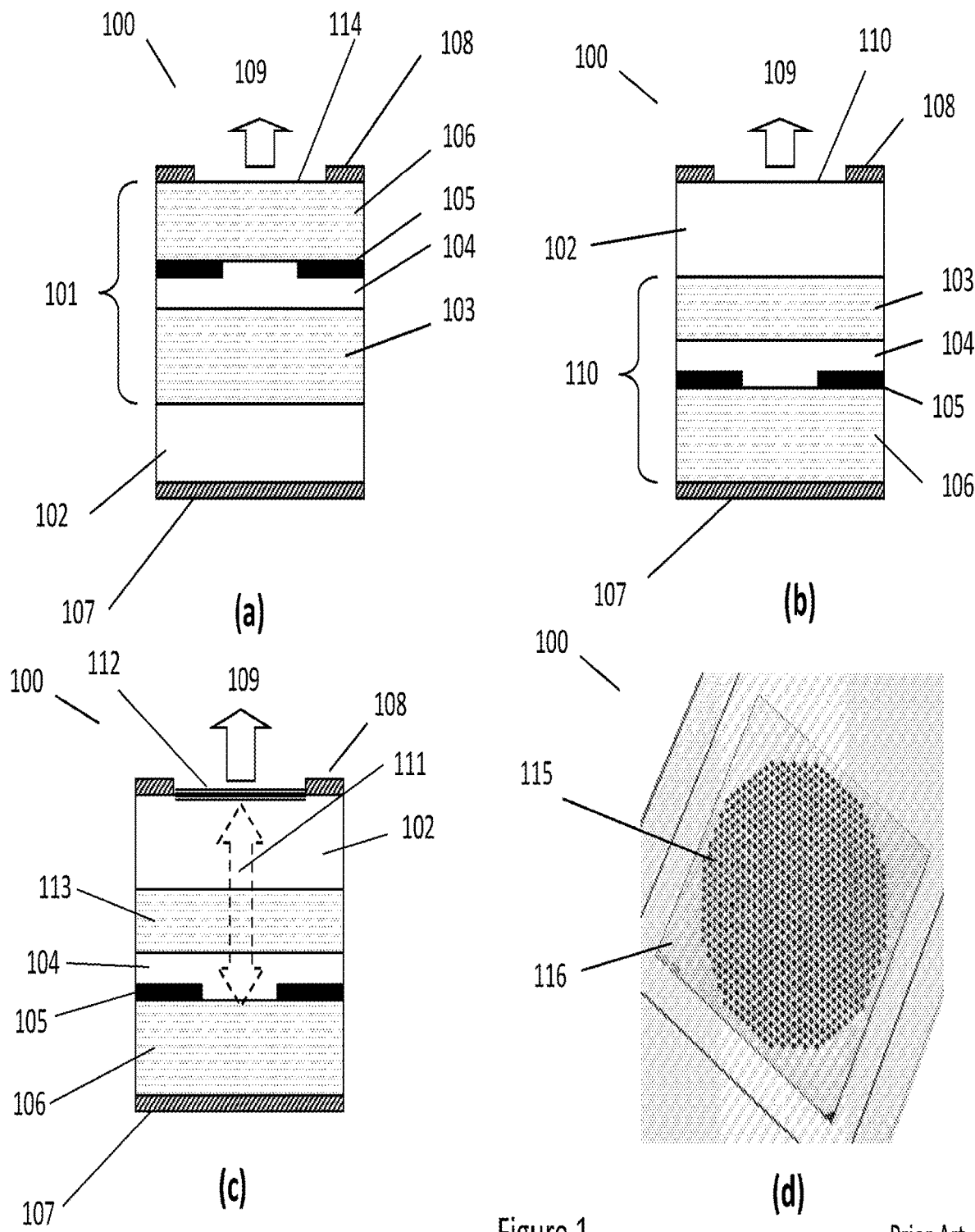
FIGS. 1(a)-1(d) show examples of current state of the art VCSEL devices and VCSEL arrays. They include simple VCSEL device, external mirror VCSEL devices, multiple quantum well stack high gain VCSELs and monolithic VCSEL arrays.

FIG. 1 describes various types of VCSELs and VCSEL arrays 100 that can be used to build an encapsulated illumination module. FIG. 1(a) shows a top emitting VCSEL in which the VCSEL structure 101 is fabricated on the top of the substrate 102 and the output beam 109 is transmitted out of the top of the device. The VCSEL structure 101 comprises the bottom DBR high reflecting mirror 103 and the top DBR partially reflecting mirror 106 which transmits the output beam 109. The two mirrors form the laser resonant cavity and in between is the gain region 104. The gain region 104 consists of a group or stack of multiple quantum wells and these are typically activated by a current flowing between electrodes 108 and 107. In some designs the quantum wells are activated by shining a laser beam on them to optically pump the carriers.

In a more recent VCSEL design multiple stacks of quantum wells are used to obtain higher gain, increased power and higher efficiency. Tunnel junctions are used between the stacks to separate them. In VCSELs activated by current an aperture 105 is used to concentrate the current in the center region. This aperture is typically formed by oxidation although other techniques such as ion implantation can be used to form the electrically insulating region around the aperture.

FIG. 1(b) shows an alternative bottom emitting VCSEL in which the VCSEL structure 110 is fabricated on the bottom side of the substrate 102 with the bottom DBR mirror 113 made partially reflecting and the top mirror 106 high reflecting so that the output beam 109 is transmitted through the substrate 102. This has the advantage that the VCSEL structure can be bonded in direct contact with a heat sink for more efficient cooling.

FIG. 1(c) describes a three mirror extended cavity VCSEL 100. A third mirror 112 is formed on the substrate surface so that the laser resonant cavity 111 is increased in length. This has advantages in forming lower divergent output beams with fewer transverse modes to produce a higher brightness beam. An external cavity version of this VCSEL can also be made in which the third mirror is a separate component allowing a much longer cavity length to be used. External cavity VCSELs can be made using top emitting or bottom emitting VCSEL configurations.

All of these various types of VCSELs can be configure into monolithic VCSEL arrays as shown in FIG. 1(d). The VCSEL devices 114 are fabricated in a common substrate 115. Many different configurations of arrays can be made including regular arrays of devices or non-regular arrays where the spacing is non-uniform, either random or of a specific structure. The arrays can be made very dense with more than 5000 VCSEL elements in a monolithic array. The devices can be connected together in parallel to be operated all at the same time or separate electrodes can be deposited to activate each VCSEL device individually or in groups. All of these various types and configurations of VCSELs 100 can be used in the encapsulated illumination module. Which specific VCSEL configuration is used will depend on the illumination application.

Figure 2:
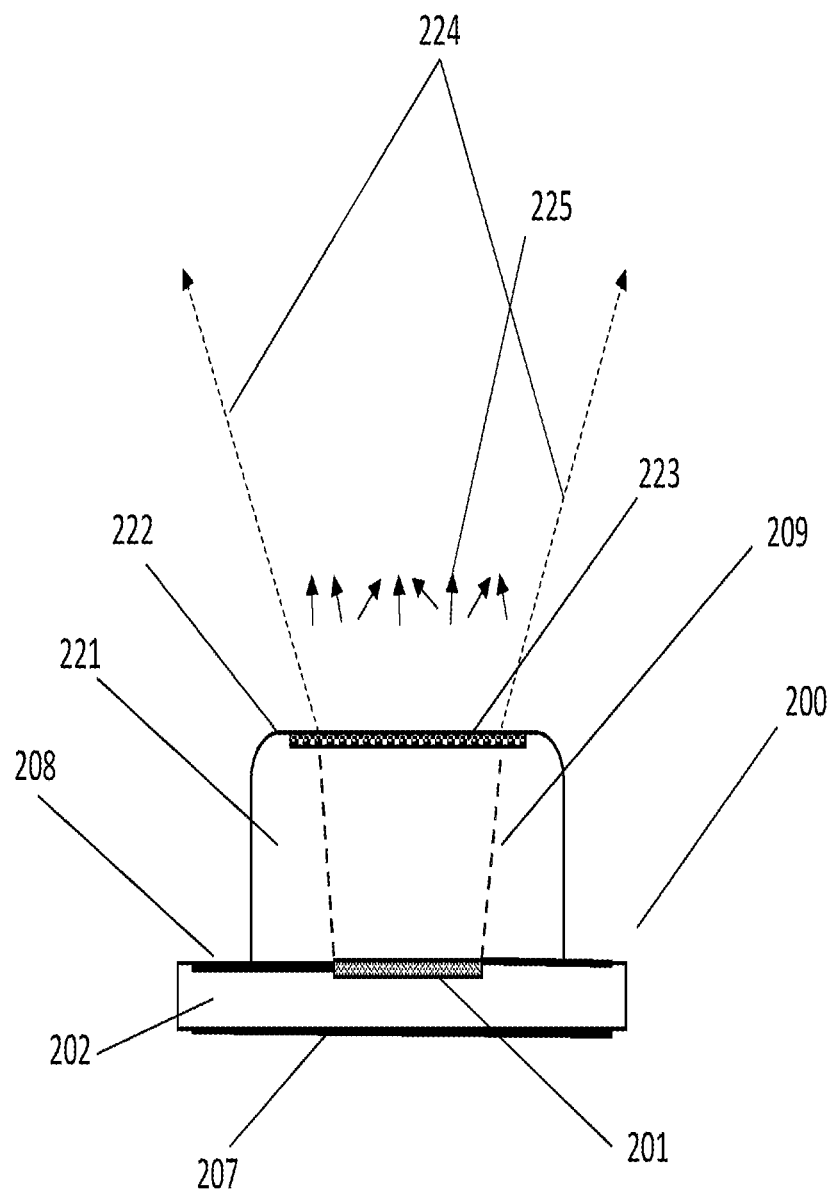
FIG. 2 illustrates the encapsulation of a VCSEL device or VCSEL array. The top of the encapsulant has an optical function fabricated in it which modifies the properties of the VCSEL output beam.

FIG. 2 is a schematic diagram of the VCSEL device or VCSEL array 200 with encapsulant 221 formed on the light emitting side of the chip. The VCSEL example shown in FIG. 2 is a top emitting VCSEL but a bottom emitting VCSEL or one of the other types described in FIG. 1 could equally be used. The encapsulant covers the active region 201 to include the output beam of the VCSEL but leaves a portion of the edge of the chip exposed so that the top contact 208 is available for connection to the activation source. The second contact 207 for activation of the VCSEL is on the opposite side of the VCSEL. The VCSEL with encapsulant is a self-contained module which can be mounted on a submount or printed circuit board in the normal manner.

The encapsulant has an optical diffusing structure 223 fabricated in the surface region 222 in the path of the VCSEL output beam 209. This particular structure is a collection of various sized microlenses which result in an increase in divergence 224 of the VCSEL beam with a defined intensity distribution, for example a flat top intensity profile. Depending on the size of the microlenses compared to the beam(s) from the VCSEL the diffusing microlens structure may also scramble the beam 225 causing localized variations in the beam direction. For VCSEL arrays this can reduce speckle effects by mixing beam components from different VCSELs in the array into the total beam thus reducing the coherence.

Figure 3:
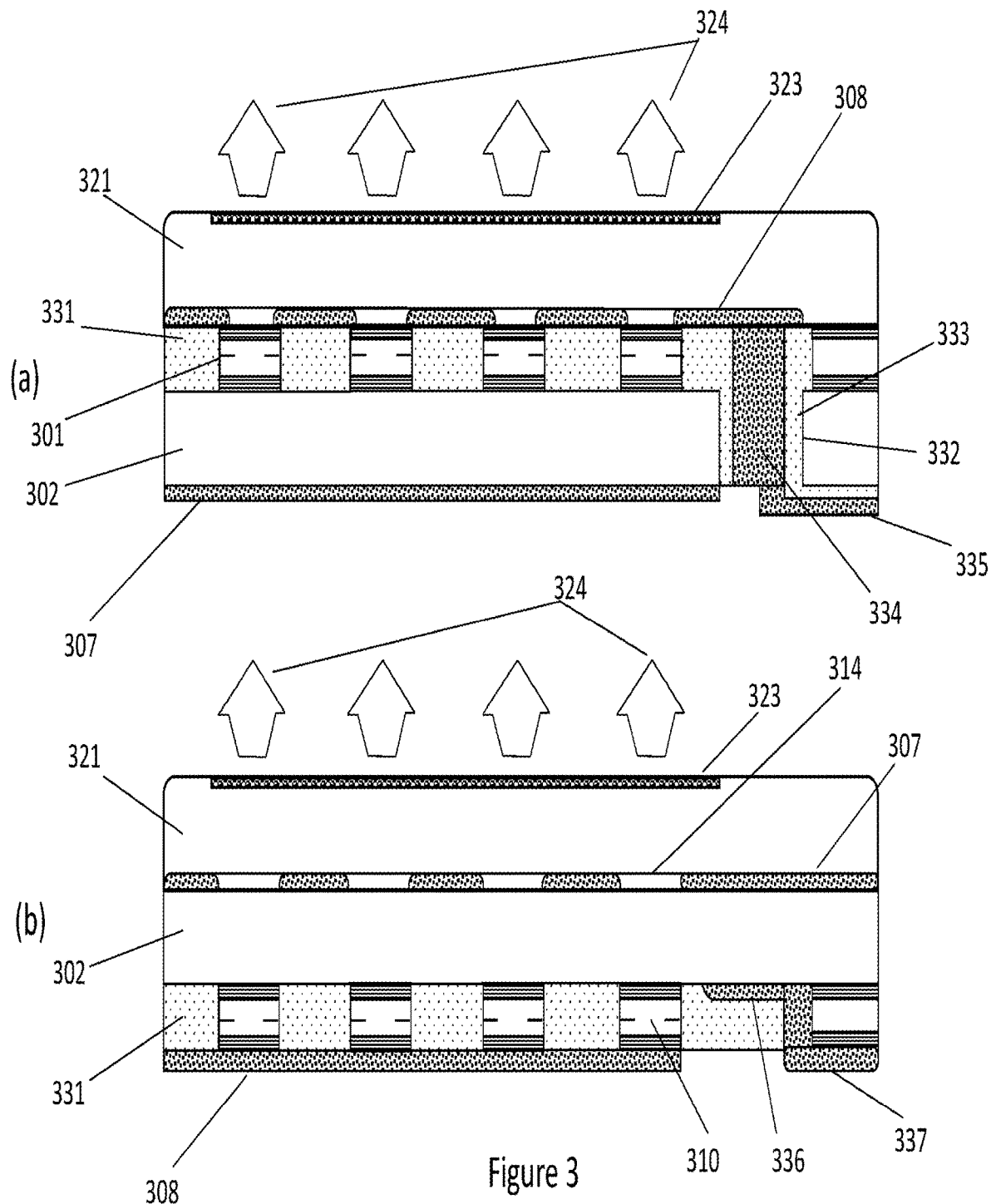
FIGS. 3(a) and 3(b) show two embodiments of an encapsulated VCSEL array. The configuration of FIG. 3(a) is top emitting and the configuration of FIG. 3(b) is bottom emitting. In both cases the VCSEL is surface mountable with both electrical contacts on the non-emitting side and the encapsulant with optical component is on the emitting side.

An improved embodiment of the encapsulated VCSEL is achieved by using surface mount type VCSELs as shown in FIG. 3. Surface mount VCSELs are made by fabricating a suitable via 332 for routing the electrical contact on the emitting side of the VCSEL through to the non-emitting side alongside the other electrical contact 307. FIG. 3(a) is an example of a VCSEL array of top emitting VCSELs 301 that is surface mountable with both contacts 307, 335 on the bottom side of the substrate 302. This configuration could equally apply to a single top emitting VCSEL device. A via 332 is fabricated in the substrate for routing a lead 334 from the top contact 308 through the substrate 302 to a contact 335 on the bottom side. Isolation and/or passivation material 331 is used to electrically isolate the top pad from the substrate to prevent an electrical short to the substrate and bottom pad 307. This insulating material is also deposited 333 in the via and on the bottom side of the substrate between the contact 335.

The encapsulant 321 can now be deposited to completely cover the emitting side of the VCSEL chip since all the electrical contacts are on the non-emitting side. The optical structure 323 is formed in the surface of the encapsulant in the path of all the beams from the VCSEL array. The modified output beams 324 are emitted out of the top of the illumination module. This produces a more robust chip illumination module since the encapsulant completely covers the active side of the VCSEL and can even be made to cover around the edges of the chip as well. This module is compatible with low cost high volume surface mount electronic assembly processes since both electrical contacts are on one side of the VCSEL.

FIG. 3(b) describes the equivalent version for an array of bottom emitting VCSELs 310. In this configuration the VCSEL output is transmitted through the substrate through apertures 314 in the bottom contact 308. If the substrate 302 is conducting then a via in the substrate is not required. The electrical connection to the bottom contact 308 is obtained using a contact 336 on the non-emitting side of the substrate and this is connected to the contact pad 337. Isolation and/or passivation material 331 is used to electrically isolate the bottom contact 307 from the substrate 302.

In a similar manner the encapsulant 321 can now be deposited to completely cover the emitting side of the VCSEL chip since all the electrical contacts are on the non-emitting side. The optical structure 323 is formed in the surface of the encapsulant in the path of all the beams from the VCSEL array. The optical structure design will be different since the VCSEL output beams have different properties since they have propagated through the substrate as well as propagating through the encapsulant. The output beams 324 modified by the optical structure are emitted out of the top of the illumination module. This produces a more robust chip module since the encapsulant completely covers the VCSEL substrate and contact(s) and can even be made to cover around the edges of the chip as well. This is compatible with low cost high volume surface mount electronic assembly processes. It will be appreciated by persons skilled in the art that a similar arrangement can be used for other types of surface mount VCSELs including three mirror extended and external cavity single VCSELs and arrays.

More information and descriptions of surface mount VCSELs is disclosed in the U.S. Pat. No. 8,783,893 issued on Jul. 22, 2014, to Seurin et al., U.S. Pat. No. 8,675,706 by Seurin et al. issued on Mar. 18, 2014 and U.S. Pat. No. 9,268,012 by Ghosh et al. issued Feb. 23, 2016. Contents of the above patents are co-authored by some of the inventors of this application and co-owned by Princeton Optronics Inc. Mercerville, N.J.

Figure 4:
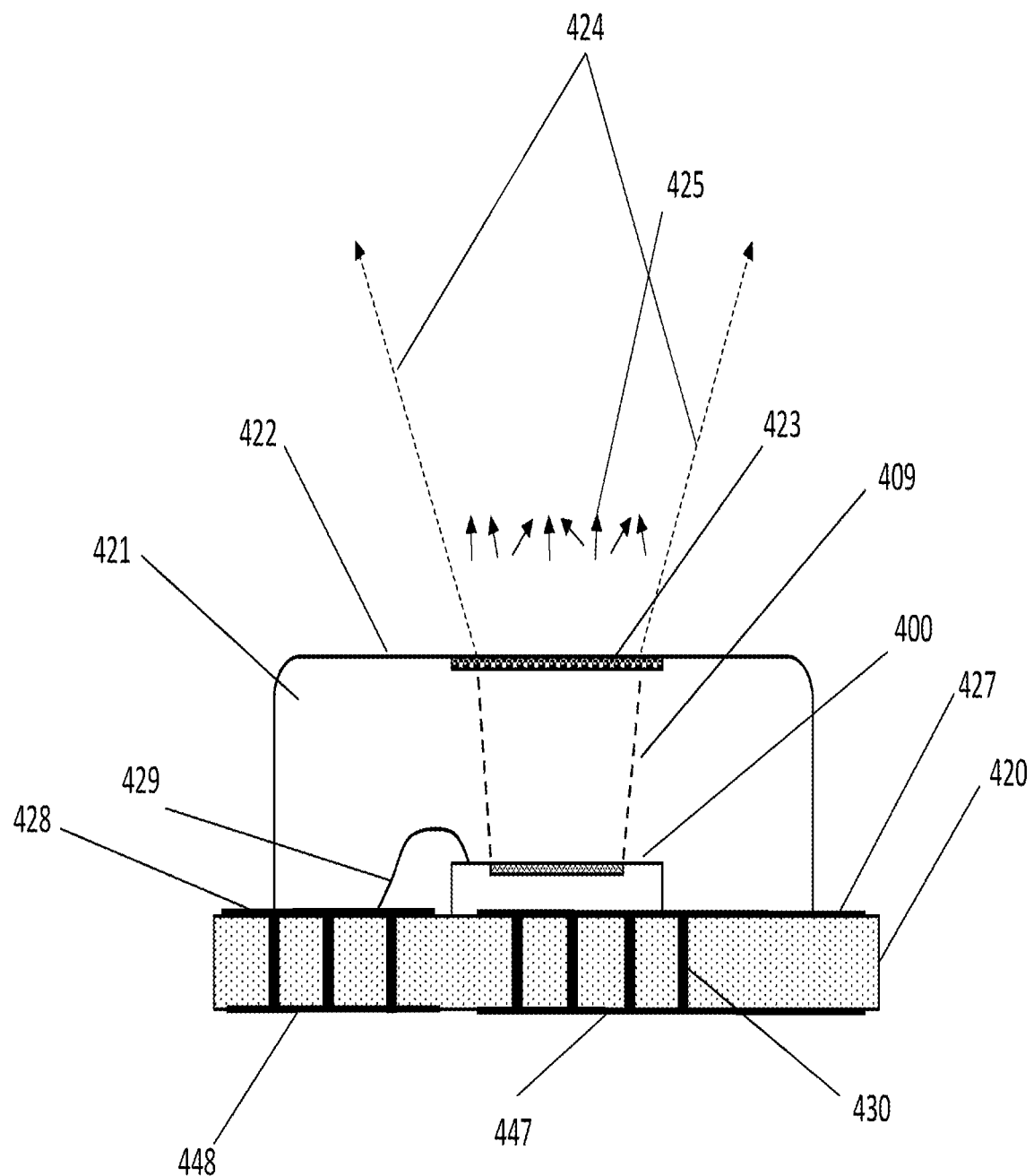
FIG. 4 illustrates a VCSEL module mounted on a submount with encapsulant fully covering the VCSEL and partially covering the submount. An optical structure is formed in the encapsulant for modifying the VCSEL output beam.

FIG. 4 shows the VCSEL or VCSEL array 400 mounted on a submount 420 with encapsulant 421 fully covering the VCSEL and partially covering the submount on the VCSEL side. The VCSEL can include electrical wirebond connections 429 to the submount, or can be a surface mount VCSEL with all contacts on its bottom side, thus not requiring wirebond connections to the top side of the submount. The submount will have pads 427, 428 for connecting to the VCSEL with leads from these pads to other pads for connecting to other components in the final module. The other pads need to be outside the encapsulant but can be either side of the submount. To be compatible with surface mount assembly processes all the other pads should be on the bottom side of the submount. This can be accomplished using conducting vias 430 for connecting the upper pads to pads on the opposite side.

The encapsulant 421 has an optical diffusing structure 423 formed on the surface region 422 in the path of the VCSEL output beam 409. This can be designed to increase the divergence 424 or reduce the divergence of the VCSEL beam, depending on the intended application. There are many different beam characteristics that can be obtained and some these will be discussed more in the following paragraphs.

Figure 5:
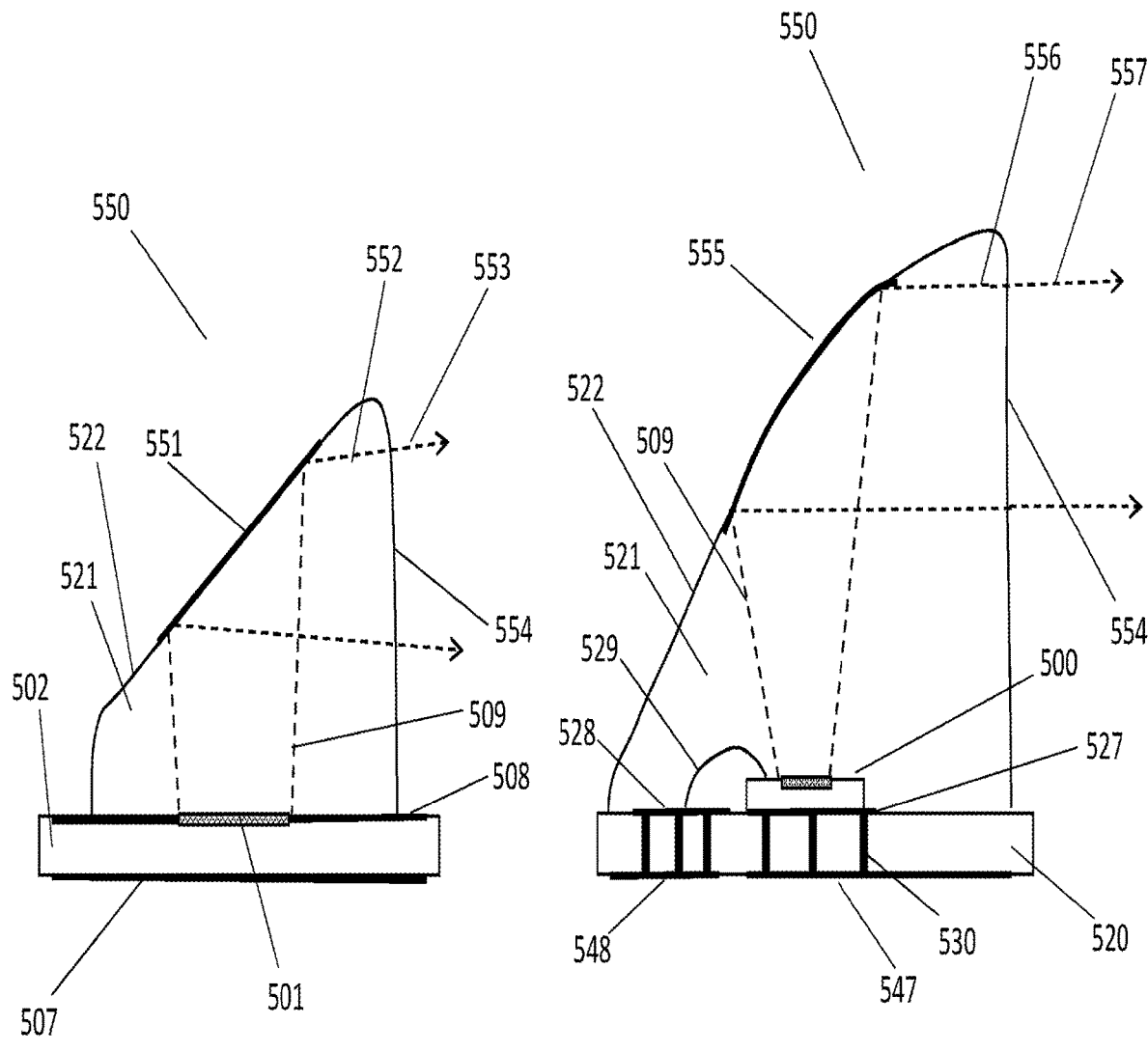
FIGS. 5(a) and 5(b) show the embodiment using a mirror on the encapsulant surface to redirect the VCSEL output beam in a different direction within the encapsulant. The output beam exits the encapsulant through a different region of the surface.

The discussion up to now has described how the VCSEL output beam characteristics can be modified using an optical structure at the output surface of the encapsulant. In these embodiments, the output beam direction is approximately the same as the beam output direction from the VCSEL. Although the beam direction can be modified using the surface structure there may be limitations in achieving large changes in direction. An additional function which will accomplish large changes in beam direction is shown in FIG. 5. In this embodiment of the invention a mirror surface 551 is formed to intercept the beam 509. This can be accomplished by a tilted surface 522 with the incident angle large enough so that there is total internal reflection at the surface. Alternately a reflecting layer can be deposited or fabricated on the encapsulant surface 551.

After being reflected the output beam 552 which remains inside the encapsulant 521 is propagated to a different region 554 of the encapsulant surface to transmit out 553 of the encapsulant. This configuration in FIG. 5(a) results in a large deflection of the VCSEL beam and in this example the beam is parallel to the VCSEL surface. It should be appreciated that the examples in FIG. 5 show the redirected beam is parallel the VCSEL surface however the beam can be redirected in other directions by changing the tilt angle of the mirror 551, 555.

Another embodiment of this is shown in FIG. 5(b) using a curved mirror surface 555 on the encapsulant. The convex surface as shown will result in converging the VCSEL output beam 509 to reduce its divergence 556. This would be beneficial in application where a collimated illumination beam 557 is required for illuminating objects at a large distance away. It will be apparent to persons skilled in the art that a concave surface could alternately be used which would expand the beam and result in a transmitted beam 557 with large divergence. As shown in FIGS. 5(a) and 5(b) the mirror surface can be used in arrangements in which the encapsulant is fabricated on a VCSEL substrate or on a VCSEL mounted on a submount as described in FIGS. 2 and 4.

Figure 6:
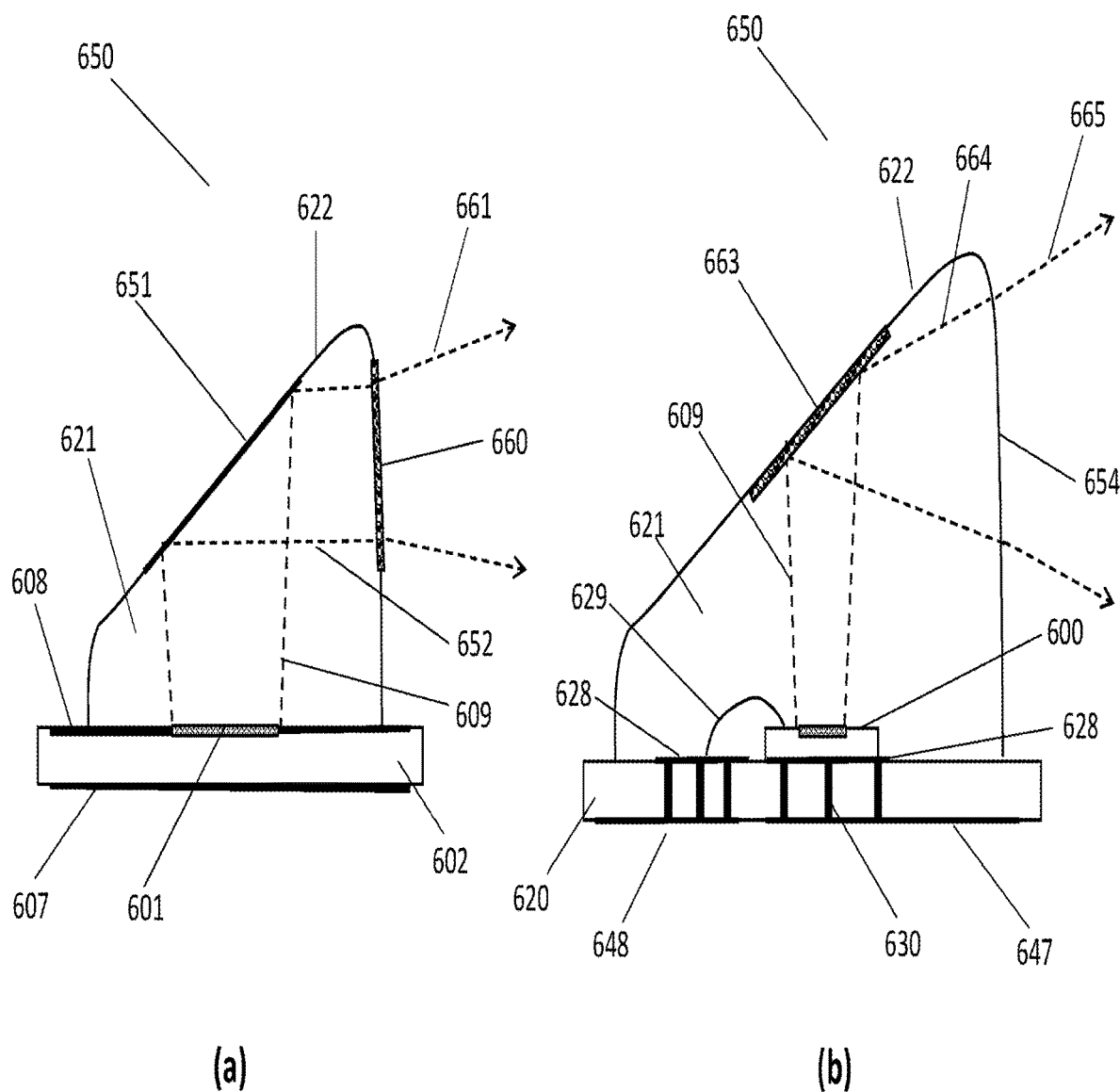
FIGS. 6(a) and 6(b) illustrate examples of more complex encapsulant configurations.

Optical diffusing structures can be incorporated with the mirror surface embodiment. Two methods for obtaining this are shown in FIG. 6. FIG. 6(a) describes an embodiment in which a mirror surface 651 is used to redirect 652 the VCSEL output beam 609 direction. The beam is then incident on the output surface 660 which incorporates a diffusing structure 660 to modify the divergence and intensity distribution of the beam. This beam 661 is transmitted out of the encapsulant.

FIG. 6(b) shows an alternative embodiment for combining the mirror function and the optical diffusing structure. In this arrangement, the optical diffusing structure is combined with the mirror 663. The VCSEL output beam 609 is incident on this surface and is both redirected and its divergence and intensity distribution modified 664 to form the desired VCSEL beam characteristics. This beam is then transmitted through the output surface 654. It will be apparent to persons skilled in the art that other combinations can be made including fabricating optical diffusing structures both with the mirror 663 and in the output surface 654. These embodiments provide a lot of flexibility and the ability to use multiple optical structures to obtain the desired VCSEL beam characteristics from the illumination module.

The next part of the description provides more information on the various forms of optical diffusing structures that can be used in the encapsulant surface to obtain different VCSEL output beam divergence and intensity distributions. Methods for fabricating these optical structures include molding the encapsulant where the mold includes the optical structure or using multiple molding steps, one for the basic encapsulant structure and subsequent mold steps for additional structure elements. The optical structure could be etched into the surface after the encapsulant has been deposited or molded onto the VCSEL or VCSEL on submount. The fabrication could also include one or more film depositions on the encapsulant surface.

Figure 7:
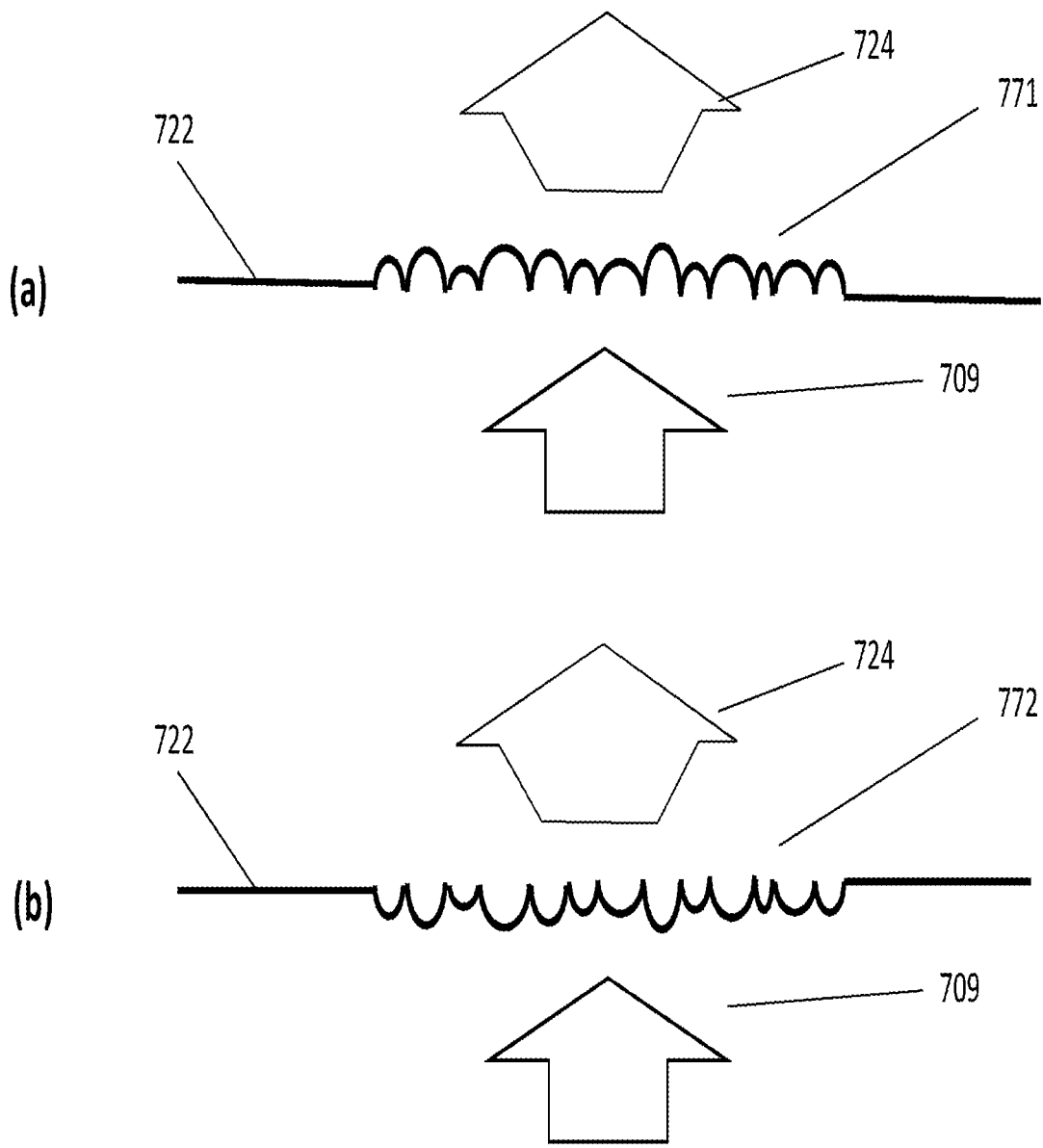
FIGS. 7(a) and 7(b) shows diagrams describing two different forms of a diffuser optical element using microlenses fabricated in the surface of the encapsulate to increase the divergence of the VCSEL beam.

FIG. 7 describes two variants of an optical diffuser which uses arrays of microlenses. FIG. 7(a) shows an array of convex microlenses 771 which increase the divergence by focusing separate parts of the output beams 709 to focal points close to the lens after which the beams diverge 724 at larger angles than the incident beam. There is a mixture of different size and focal length microlenses and this mixture is specifically designed so that the beam can be expanded to form a beam 724 with the intensity distribution which is designed for the required illumination application.

FIG. 7(b) describes an alternative design in which the microlenses 772 are concave profile. These microlenses each increase the divergence of parts of the incident beam 709 directly without going through a focal point. In the same way the size and shape of the microlenses are designed and configured to obtain a specific illumination beam intensity distribution for the required illumination application. It should be apparent to those skilled in the art that a combination of both convex and concave microlenses could also be used to obtain a desired illumination pattern.

Figure 8:
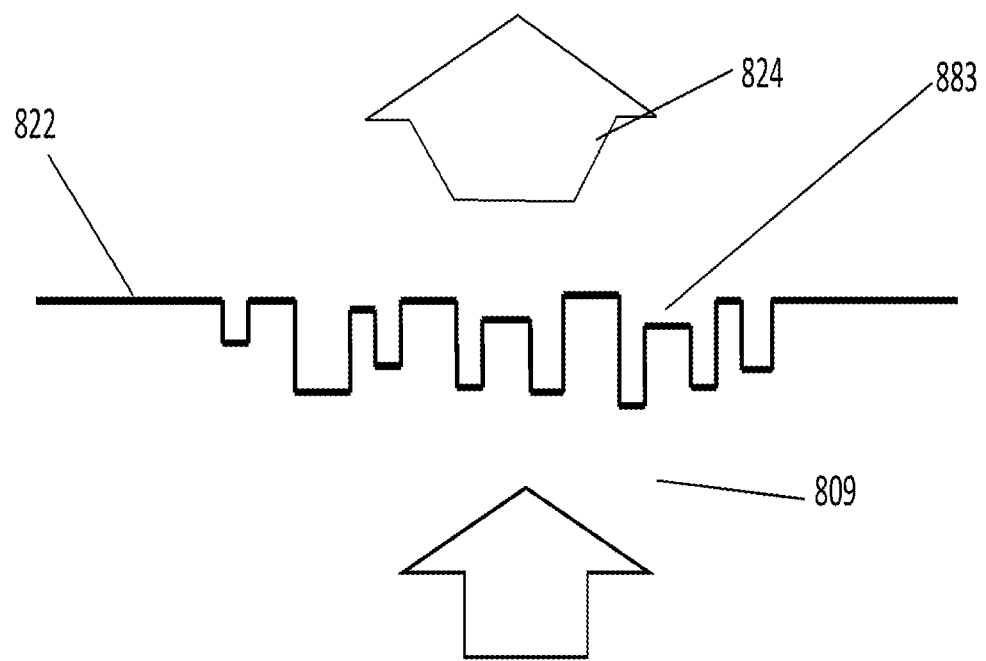
FIG. 8 illustrates a typical structure of a diffractive optical element formed in the surface of the encapsulant. The diffractive element is shown increasing the divergence of the VCSEL beam however diffractive structures can be used to perform many different optical functions including focusing, imaging and forming multispot structured patterns from the VCSEL beam.

An alternative optical structure to obtain a desired illumination pattern or radiation distribution is a diffractive element 883 as shown in FIG. 8. This can be formed in the surface 822 of the encapsulant at the location of the VCSEL output beam 809. This diffraction element 883 comprises an array of rectangular indentations in two dimensions. This structure breaks the incident VCSEL beam into small beamlets which have different optical phases. Since they are coherent beams they interfere to form a divergent beam with a defined intensity distribution. The intensity distribution 824 is determined by the design of the diffractive structure which is arranged to provide an illumination pattern suitable for the intended application. This illumination pattern can have increased or reduced divergence or a combination to form a more complex intensity pattern 824. Also this structure can be used to form various configurations of spot patterns typically used for structure light 3D image sensing.

Figure 9:
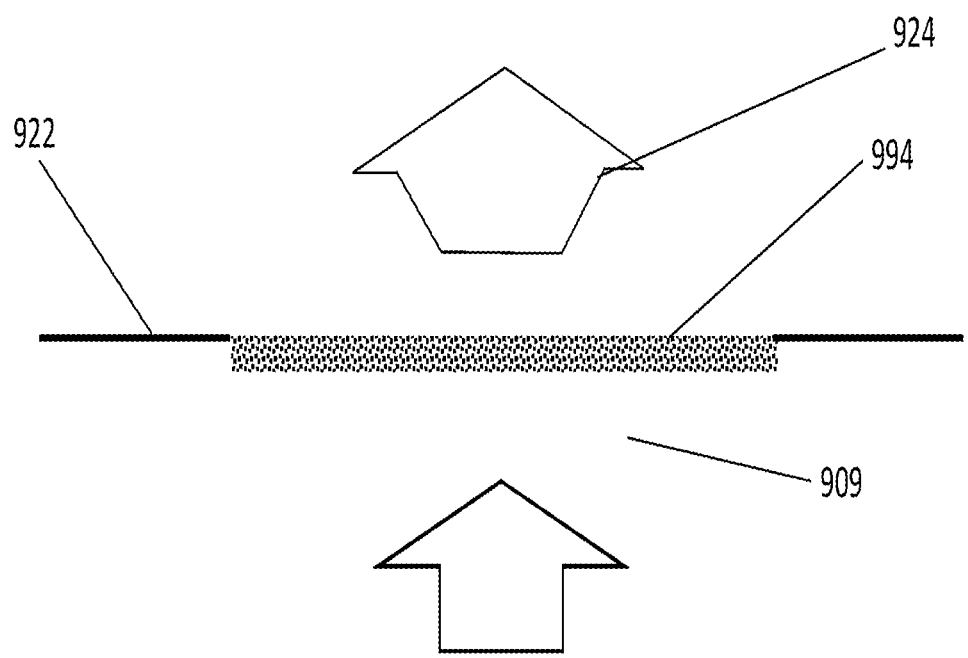
FIG. 9 shows a diffusing structure formed into the encapsulant. In this structure a scattering matrix is molded into the encapsulant to scatter the VCSEL beam thus increasing the divergence.

Another embodiment of the invention is to use a scattering surface or matrix 994 to increase the divergence of the VCSEL beam. An example of this is described in FIG. 9. A rough non-specular region 994 is formed on the surface of the encapsulant 922. The VCSEL output beam 909 is scattered by this beam and propagates out of the encapsulant as a diverging beam 924. An alternative form of the scattering structure 994 can be a film of transparent material deposited or otherwise incorporated into the surface that includes small scattering particles mixed into it which scatter the incident beam.

Figure 10:
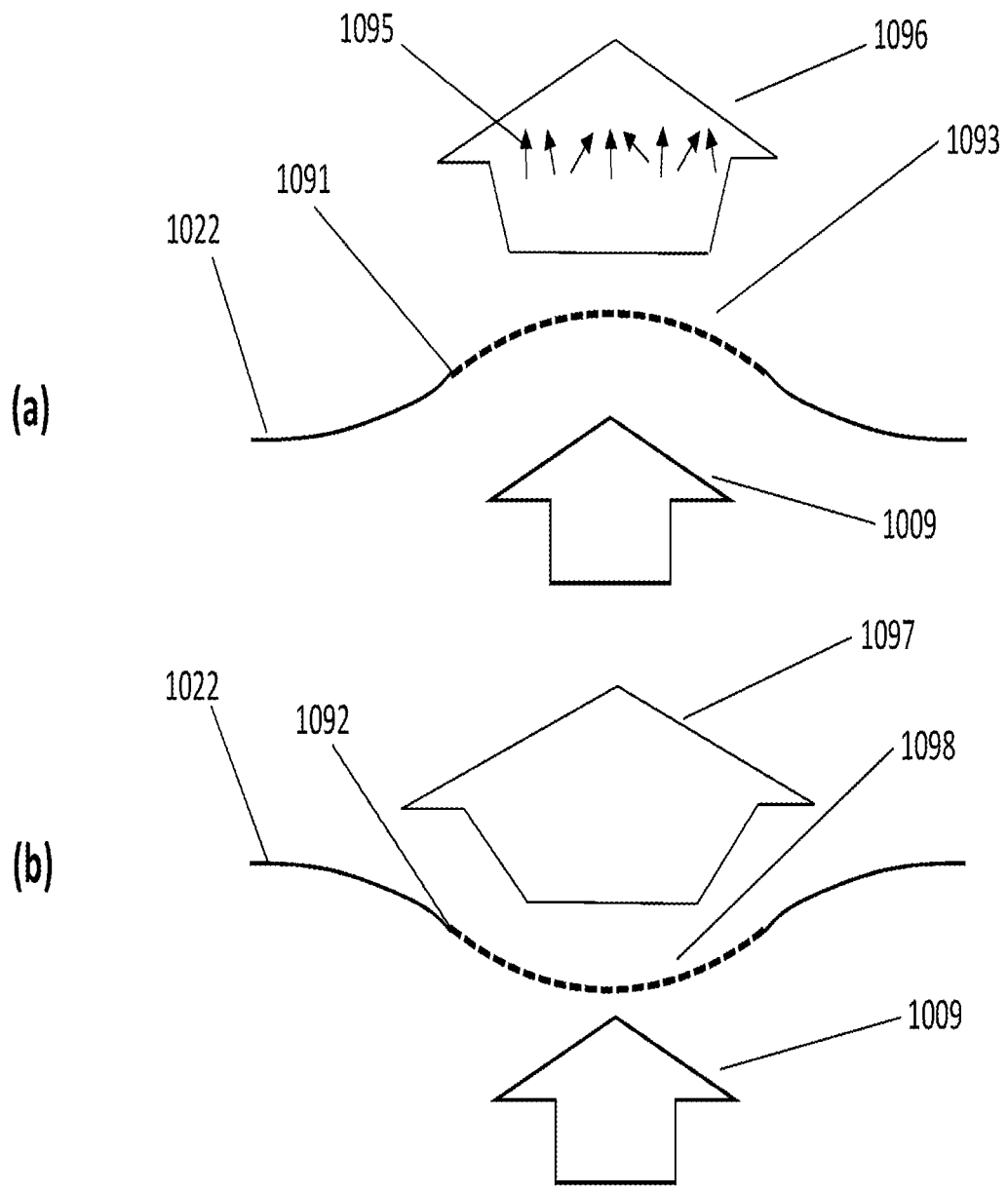
FIGS. 10(a) and 10(b) illustrate how multiple optical functions can be fabricated in the encapsulant.

The surface of the encapsulant 1022 can be fabricated to be a curved surface instead of flat. This would provide positive or negative optical lens power to modify the VCSEL beam. These embodiments are described in two diagrams in FIG. 10. FIG. 10(*a*) shows the surface formed into a convex spherical or aspherical surface 1091. The surface could also be a cylindrical shape or other asymmetric curve. The diffusing structure 1093 is then formed on this non-flat surface. The convex surface would act to converge the beam as well as altering the characteristics of the beam 1096. An example where this could be beneficial is with a VCSEL array. The diffusing structure 1093 scatters the individual beams 1095 from the VCSEL array devices in different directions so that the individual beams overlap. The convex surface acts to converge the beam so that the overall beam divergence can be adjusted to suit the specific application. The benefit from overlapping the beams is to greatly reduce the coherence of the total beam reducing speckle effects when the beam is incident on illuminated objects.

FIG. 10(*b*) describes the effect of using a concave surface profile 1092. The concave lens increases the divergence 1097 of the incident VCSEL beam 1009. The diffusing structure 1098 then modifies the intensity distribution within the expanded beam 1097. The same benefit of reducing the beam coherent and speckle effects would occur when using a VCSEL array.

It will be apparent that many different configurations of the encapsulated illuminator package can be designed and made depending on the application and assembly requirements of the product that will use it. Although a broad framework of the invention is described with reference to a few preferred embodiments, other embodiments may be configured by applying combinations and sub-combinations of elements described herein, depending on particular VCSELs or VCSEL arrays required for the illuminator applications. Variations and modifications of different embodiments both with or without different optical structures and mirrors that will be apparent to those skilled in the art are within the scope of the invention and are covered by appended claims.

What is claimed is:

1. A VCSEL illuminator package comprising:
   one or more VCSELs in a substrate, the one or more VCSELs operable to generate a VCSEL output radiation beam;
   an encapsulant that completely encloses the one or more VCSELs;
   an optical structure integrated in the encapsulant, the optical structure being disposed in a path of the VCSEL output radiation beam and operable to change at least one of a propagation characteristic or intensity distribution of the VCSEL output radiation beam exiting the encapsulant;
   an optical reflector at a surface of the encapsulant, the optical reflector operable to re-direct the VCSEL output radiation beam generated by the one or more VCSELs in a different direction within the encapsulant toward the optical structure,
   wherein the optical reflector includes a curved reflecting surface of the encapsulant that modifies a divergence of the VCSEL output radiation beam;
   wherein the optical reflector is an inclined surface of the encapsulant that is tilted at an angle to provide total internal reflection of the VCSEL output radiation beam incident on the inclined surface.

2. The VCSEL illuminator package of claim 1 wherein each of the one or more VCSELs has contacts on a non-emitting side, and wherein the illuminator package is surface mountable.

3. The VCSEL illuminator package of claim 2 including an electrical contact on a light emitting-side surface of the substrate, wherein at least part of the electrical contact is not covered by the encapsulant.

4. The VCSEL illuminator package of claim 1 wherein the substrate is mounted on a submount that has electrical contacts on a surface opposite a surface on which the substrate is mounted, and wherein the illuminator package is surface mountable.

5. The VCSEL illuminator package of claim 4 including an electrical contact on the surface of the submount on which the substrate is mounted, wherein at least part of the electrical contact on the surface of the submount is not covered by the encapsulant.

6. The VCSEL illuminator package of claim 1 wherein the optical structure comprises an array of microlenses.

7. The VCSEL illuminator package of claim 1 wherein the optical structure comprises an optical diffusing structure.

8. The VCSEL illuminator package of claim 1 wherein the optical structure comprises a light scattering structure.

9. The VCSEL illuminator package of claim 1 wherein the optical structure comprises an optically diffractive structure.

10. The VCSEL illuminator package of claim 9 wherein the optically diffractive structure includes indentations in a surface of the encapsulant.

11. The VCSEL illuminator package of claim 10 wherein the indentations are rectangular.

12. The VCSEL illuminator package of claim 1 wherein the optical structure is disposed at a surface of the encapsulant from which the VCSEL output radiation beam exits.

13. The VCSEL illuminator package of claim 1 wherein the optical structure is an etched structure at a surface of the encapsulant.

14. A method of manufacturing a VCSEL illuminator package, the method comprising:
   providing one or more VCSELs in a substrate, the one or more VCSELs operable to generate a VCSEL output radiation beam;
   providing an encapsulant that completely encloses the one or more VCSELs;
   providing an optical structure that is integrated with the encapsulant, the optical structure being disposed in a path of the VCSEL output radiation beam and operable to change at least one of a propagation characteristic or intensity distribution of the VCSEL output radiation beam exiting the encapsulant; and
   providing an optical reflector at a surface of the encapsulant, the optical reflector operable to re-direct the VCSEL output radiation beam generated by the one or more VCSELs in a different direction within the encapsulant toward the optical structure, wherein the optical reflector includes a curved reflecting surface of the encapsulant that modifies a divergence of the VCSEL output radiation beam; and wherein the encapsulant is molded using a mold that includes features that form the optical structure.

15. The method of claim 14 wherein providing the optical structure includes etching the optical structure into a surface of the encapsulant.

16. A VCSEL illuminator package comprising:
one or more VCSELs in a substrate, the one or more VCSELs operable to generate a VCSEL output radiation beam;
an encapsulant that covers the one or more VCSELs;
an optical structure integrated in the encapsulant, the optical structure being disposed in a path of the VCSEL output radiation beam and operable to change at least one of a propagation characteristic or intensity distribution of the VCSEL output radiation beam exiting the encapsulant; and
further comprising an optical reflector at a surface of the encapsulant, the optical reflector operable to re-direct the VCSEL output radiation beam generated by the one or more VCSELs in a different direction within the encapsulant toward the optical structure;

wherein the optical reflector includes a curved reflecting surface of the encapsulant that modifies a divergence of the VCSEL output radiation beam; and wherein the optical reflector is disposed on an inclined surface of the encapsulant and includes a reflecting layer on the inclined surface.

17. The VCSEL illuminator package of claim 16 wherein the optical structure comprises an array of microlenses.

18. The VCSEL illuminator package of claim 16 wherein the optical structure comprises an optical diffusing structure.

19. The VCSEL illuminator package of claim 16 wherein the optical structure comprises a light scattering structure.

20. The VCSEL illuminator package of claim 16 wherein the optical structure comprises an optically diffractive structure.

* * * * *